United States Patent
Chen

(10) Patent No.: US 9,537,031 B2
(45) Date of Patent: Jan. 3, 2017

(54) NOZZLE ASSEMBLY AND METHOD FOR FABRICATING A SOLAR CELL

(71) Applicant: TSMC Solar Ltd., Taichung (TW)

(72) Inventor: Shih-Wei Chen, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 468 days.

(21) Appl. No.: 13/929,827

(22) Filed: Jun. 28, 2013

(65) Prior Publication Data

US 2015/0004734 A1    Jan. 1, 2015

(51) Int. Cl.
- *H01L 21/00* (2006.01)
- *H01L 31/0463* (2014.01)
- *H01L 21/67* (2006.01)

(52) U.S. Cl.
CPC ....... *H01L 31/0463* (2014.12); *H01L 21/6715* (2013.01); *Y02E 10/50* (2013.01)

(58) Field of Classification Search
CPC .................................................. H01L 31/0463
USPC ............................................. 438/57; 118/35
See application file for complete search history.

(56) References Cited

U.S. PATENT DOCUMENTS

| | | | | |
|---|---|---|---|---|
| 8,841,157 B2* | 9/2014 | Rekow | ................... | H01L 21/42 257/E31.124 |
| 2003/0082485 A1* | 5/2003 | Bulthaup | .............. | B29C 43/021 430/312 |
| 2006/0121701 A1* | 6/2006 | Basol | ................ | H01L 21/02568 438/483 |
| 2012/0211083 A1* | 8/2012 | Seike | .................... | H01L 27/301 136/263 |
| 2012/0266950 A1* | 10/2012 | Lee | ........................ | H01L 31/048 136/256 |
| 2013/0210184 A1* | 8/2013 | Niggemann | ........... | B82Y 10/00 438/57 |
| 2014/0366935 A1* | 12/2014 | Chiang | ............. | H01L 31/02246 136/256 |

(Continued)

OTHER PUBLICATIONS

Rekow, M. et al., "CIGS P1, P2, P3 Scribing Processes using a Pulse Programmable Industrial Fiber Laser", Conference Paper NREL/CP-5200-49411, Oct. 2010, Presented at the 25th European PVSEC/WCCPEC-5, Valencia, Spain, Sep. 2010, 12 pages.

(Continued)

*Primary Examiner* — Telly Green
(74) *Attorney, Agent, or Firm* — Duane Morris LLP

(57) ABSTRACT

A method for fabricating a solar cell using a nozzle assembly that includes a base portion, a scriber coupled to the base portion, and a nozzle coupled to the base portion such that the nozzle is positioned a predefined distance from a tip of the scriber is provided. The method generally comprises positioning a substructure that includes a buffer layer and an absorber layer proximate to the base portion. A P2 line is scribed through the buffer and absorber layers of the substructure using the scriber tip. A nanoparticle solution is sprayed, using the nozzle, onto at least one portion of the buffer layer at a predefined pressure when the P2 line is being scribed through the buffer and absorber layers such that a transparent conductive oxide (TCO) layer is inhibited from forming over the portion of the buffer layer that is being sprayed with the nanoparticle solution.

15 Claims, 6 Drawing Sheets

(56) References Cited

U.S. PATENT DOCUMENTS

| | | | |
|---|---|---|---|
| 2014/0366941 A1* | 12/2014 | Jee | H01L 31/05 136/256 |
| 2015/0027525 A1* | 1/2015 | Lee | H01L 31/0465 136/256 |
| 2015/0144182 A1* | 5/2015 | Kwon | H01L 31/0463 136/252 |
| 2015/0206994 A1* | 7/2015 | Tsai | H01L 31/02243 136/256 |
| 2015/0228820 A1* | 8/2015 | Chen | H01L 31/18 136/256 |
| 2015/0228821 A1* | 8/2015 | Hsu | H01L 31/18 136/256 |
| 2015/0236183 A1* | 8/2015 | Chen | H01L 31/052 136/256 |
| 2015/0263195 A1* | 9/2015 | Huang | H01L 31/02244 136/256 |
| 2015/0270417 A1* | 9/2015 | Huang | H01L 31/02243 136/244 |
| 2015/0287843 A1* | 10/2015 | Cheng | H01L 31/02167 136/256 |
| 2015/0303326 A1* | 10/2015 | Cheng | H01L 31/02244 136/256 |

OTHER PUBLICATIONS

Hongsingthong, A. et al., "ZnO Films Prepared by Two-Step MOCVD Process for Use as Front TCO in Silicon-Based Thin Film Solar Cells", 35th IEEE Photovoltaic Specialists Conference (PVSC), Jun. 2010, pp. 001508-001511, retrieved from: http://ieeexplore.ieee.org/xpl/login.jsp?tp=&arnumber=5615836&url=http%3A%2F%2Fieeexplore.ieee.org%2Fxpls%2Fabs_all.jsp%3Farnumber%3D5615836.

* cited by examiner

NOZZLE ASSEMBLY AND METHOD FOR FABRICATING A SOLAR CELL

FIELD

The disclosure relates to a deposition system that can be used for the fabrication of a solar cell and, more particularly, to a nozzle assembly that can be used with the deposition system to facilitate the selective formation of a transparent conductive oxide (TCO) layer over another layer of the solar cell.

BACKGROUND

Photovoltaic cells or solar cells are photovoltaic components for direct generation of electrical current from sunlight. Due to the growing demand for clean sources of energy, the manufacture of solar cells has expanded dramatically in recent years and continues to expand. Various types of solar cells and solar cell substructures exist and continue to be developed. For example, solar cells include a substrate, a back contact layer on the substrate, an absorber layer on the back contact layer, a buffer layer on the absorber layer, and a front contact layer above the buffer layer. In some types of solar cells, the front contact layer can include a layer of transparent conductive oxide (TCO) material forming a window for light to pass through to the other layers below.

During the formation of the layers, the solar cells undergo at least one scribing process to enable the division of large solar modules into an array of smaller series of interconnected structures on the substrate. The interconnected structures can include, for example, three scribe lines, referred to as P1, P2, and P3, that are drawn in a P1 scribe process, a P2 scribe process, and a P3 scribe process, respectively. The P1 scribe line extends through the back contact layer and is filled with the absorber layer material. The P2 scribe line extends through the buffer layer and the absorber layer and is filled with the front contact layer material. The P3 scribe line extends through each of the front contact layer, buffer layer, and absorber layer.

Each scribing process uses a laser-based or mechanical scribing technique. For example, a laser scriber can be used to segment the back contact layer by scribing P1. The scriber utilizes a wavelength of 1064 nanometers (nm) and nanosecond pulses. However, such a laser scriber may be ineffective for drawing the P2 and P3 scribe lines. As such, a mechanical scribing technique using a force-controlled stylus can be used for scribing the P2 and P3 lines. Although the mechanical scribing technique may work for scribing the P2 line, the technique may cause delamination and/or chipping of the front contact layer. Moreover, the P3 scriber can become damaged or worn over time due to all the layers that the scriber needs scribe through for the P3 scribing process.

DETAILED DESCRIPTION

Figure 1:
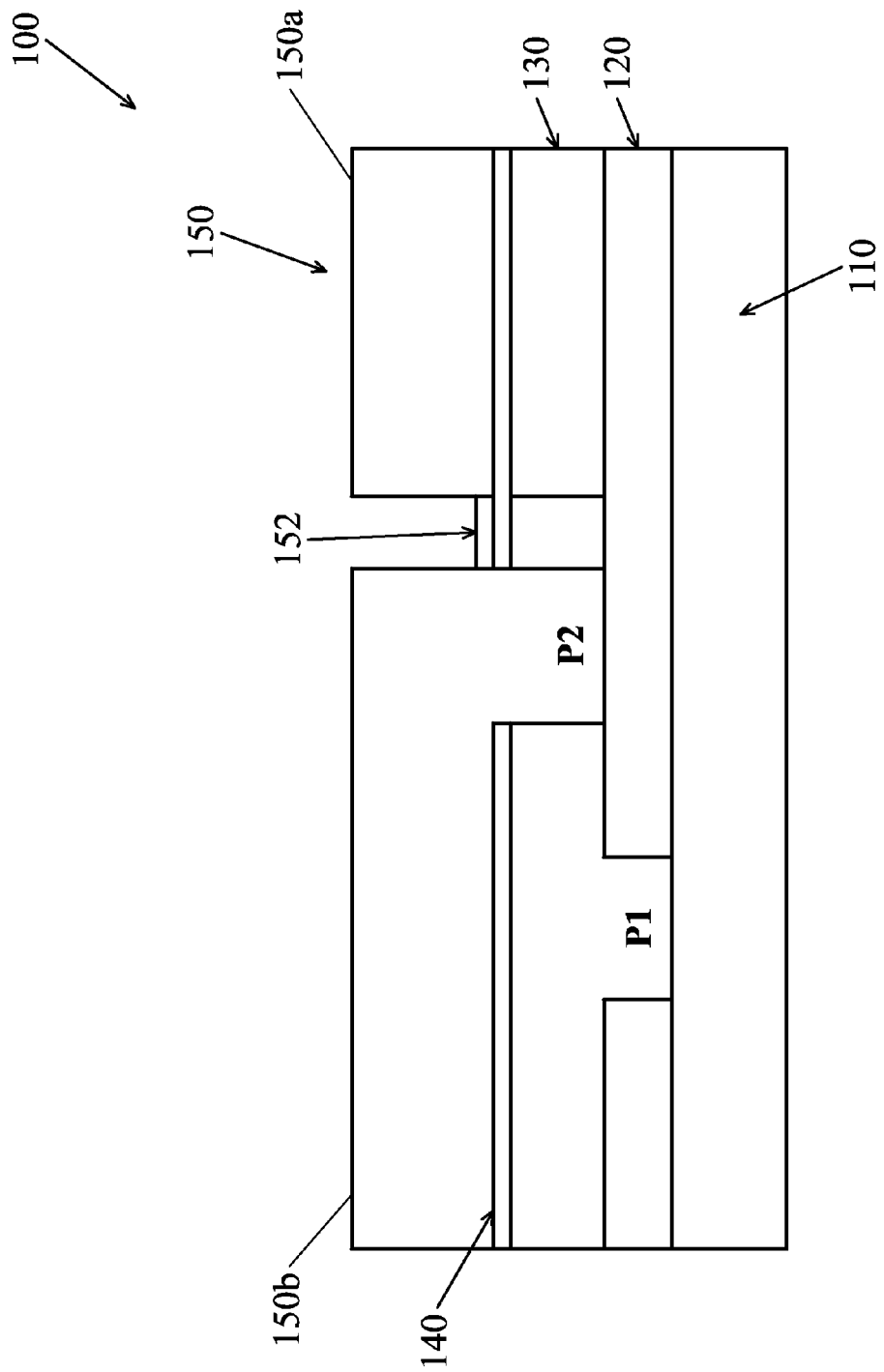
FIG. 1 is a cross-sectional view of an exemplary solar cell.

In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the deposition system be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

This description of the exemplary embodiments is intended to be read in connection with the accompanying drawings, which are to be considered part of the entire written description. The drawings are not drawn to scale. In the various drawings, like reference numerals indicate like items, unless expressly indicated otherwise in the text.

The exemplary assembly and methods described herein overcome at least some disadvantages of other techniques that are used for the fabrication of solar cells. For example, some of the embodiments described herein provide a nozzle assembly that facilitates the division of a large solar module into an array of smaller series of interconnected structures on a substrate without having to perform the P3 scribe process. The nozzle assembly includes a nozzle that is coupled to and positioned proximate to a tip of a scriber that is configured to be used for the P2 scribe process. As such, during the P2 scribe process, when the scriber tip is scribing a P2 line through a buffer layer and an absorber layer of a substructure, the nozzle sprays a nanoparticle solution onto at least one portion of the buffer layer at a predefined pressure. When a transparent conductive oxide (TCO) material is later deposited onto the buffer layer, a TCO layer is inhibited from forming over the portion of the buffer layer that was sprayed with the nanoparticle solution. As such, the TCO layer is segmented without having to undergo the P3 scribe process and, as a result, the P3 scribe process can be eliminated from the solar cell fabrication process.

FIG. 1 illustrates a cross-section of a solar cell 100. Solar cell 100 includes a substrate 110, a back contact layer 120 formed onto substrate 110, an absorber layer 130 formed onto back contact layer 120, a buffer layer 140 formed onto absorber layer 130, and a front contact layer or transparent conductive oxide (TCO) layer 150 above buffer layer 140.

Substrate 110 includes any suitable substrate material, such as glass. In some embodiments, substrate 110 can include a glass substrate, such as soda lime glass, or a flexible metal foil or polymer (e.g., a polyimide, polyethylene terephthalate (PET), polyethylene naphthalene (PEN)). Other embodiments include still other substrate materials. Back contact layer 120 includes any suitable back contact material, such as metals. In some embodiments, back contact layer 120 can include molybdenum (Mo), platinum (Pt), gold (Au), silver (Ag), nickel (Ni), or copper (Cu). Other embodiments include still other back contact materials.

In some embodiments, absorber layer 130 includes any suitable absorber material, such as p-type semiconductors. In some embodiments, the absorber layer 130 can include a chalcopyrite-based material comprising $Cu(In,Ga)Se_2$ (CIGS), cadmium telluride (CdTe), $CuInSe_2$ (CIS), $CuGaSe_2$ (CGS), $Cu(In,Ga)Se_2$ (CIGS), $Cu(In,Ga)(Se,S)_2$ (CIGSS), CdTe or amorphous silicon. Other embodiments include still other absorber materials.

Buffer layer 140 includes any suitable buffer material, such as n-type semiconductors. In some embodiments, buffer layer 140 can include cadmium sulphide (CdS), zinc sulphide (ZnS), zinc selenide (ZnSe), indium(III) sulfide (In2S3), indium selenide (In2Se3), or Zn1-xMgxO, (e.g., ZnO). Other embodiments include still other buffer materials.

In some embodiments, front contact layer 150 includes an annealed TCO layer. The TCO material for the annealed TCO layer can include any suitable front contact material, such as metal oxides and metal oxide precursors. In some embodiments, the TCO material can include zinc oxide (ZnO), cadmium oxide (CdO), indium oxide (In2O3), tin dioxide (SnO2), tantalum pentoxide (Ta2O5), gallium indium oxide (GaInO3), (CdSb2O3), or indium tin oxide (ITO). The TCO material can also be doped with a suitable dopant. In some embodiments, ZnO can be doped with any of aluminum (Al), gallium (Ga), boron (B), indium (In), yttrium (Y), scandium (Sc), fluorine (F), vanadium (V), silicon (Si), germanium (Ge), titanium (Ti), zirconium (Zr), hafnium (Hf), magnesium (Mg), arsenic (As), or hydrogen (H). In other embodiments, SnO2 can be doped with antimony (Sb), F, As, niobium (Nb), or tantalum (Ta). In other embodiments, In2O3 can be doped with tin (Sn), Mo, Ta, tungsten (W), Zr, F, Ge, Nb, Hf, or Mg. In other embodiments, CdO can be doped with In or Sn. In other embodiments, GaInO3 can be doped with Sn or Ge. In other embodiments, CdSb2O3 can be doped with Y. In other embodiments, ITO can be doped with Sn. Other embodiments include still other TCO materials and corresponding dopants.

Solar cell 100 also includes interconnect structures that include two scribe lines, referred to as P1 and P2. The P1 scribe line extends through the back contact layer 120 and is filled with the absorber layer material. The P2 scribe line extends through the buffer layer 140 and the absorber layer 130 and is filled with the front contact layer material. Interconnect structures also includes a portion 152, which is the opening defined within front contact layer 150 between segments 150a and 150b. As explained in more detail below, with respect to FIGS. 2-4, portion 152 was sprayed with a nanoparticle solution, such as a silicon dioxide (SiO$_2$) nanoparticle solution, such that first contact layer 150 is inhibited from being formed on the area that is defined as portion 152. As such, first contact layer or TCO layer 150 is segmented without having to undergo a P3 scribe process and, as a result, the P3 process is eliminated from the fabrication process for solar cell 100.

Figure 2:
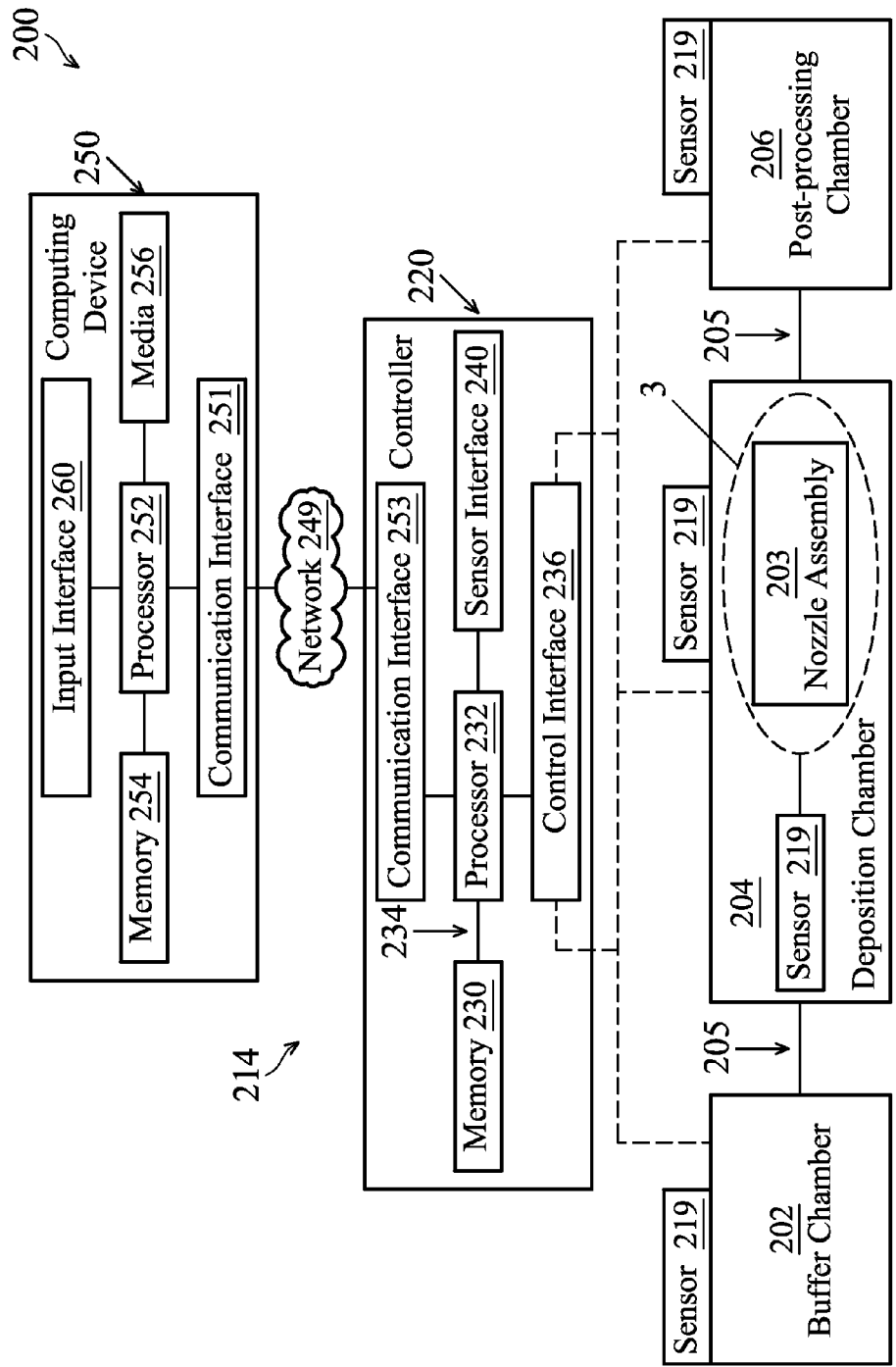
FIG. 2 is a block diagram of an exemplary deposition system used to fabricate the solar cell shown in FIG. 1.

FIG. 2 is a block diagram of an exemplary deposition system 200 used to fabricate solar cell 100 (shown in FIG. 1). In some embodiments, deposition system 200 includes a buffer chamber 202 that is configured to receive a substrate, such as substrate 110 (shown in FIG. 1), and to prepare substrate 110 therein for further processing. For example, buffer chamber 202 can include a vacuum source (not shown), a heater (not shown), and/or a heat exchanger (not shown) to facilitate providing heat energy to substrate 110, such that substrate is heated and ready to undergo further processing. A deposition chamber 204 is coupled to buffer chamber 202, via, for example, an endless conveyor 205, and deposition chamber 204 is configured to receive substrate 110 from buffer chamber 202 via endless conveyor 205. Although only one deposition 204 is shown in FIG. 2, system 200 can include any suitable number of deposition chambers 204 therein.

In some embodiments, deposition chamber 204 is configured to deposit layers, such as back contact layer 120 (shown in FIG. 1), buffer layer 140 (shown in FIG. 1), and/or absorber layer 130 (shown in FIG. 1), onto substrate 110 to form solar cell 100 or a substructure of solar cell 100. As such, deposition chamber 204 can include, for example, a vacuum pump or vacuum port (not shown), a heater (not shown), and/or a heat exchanger (not shown) to facilitate various deposition processes therein, such as sputtering and/or evaporation. In some embodiments, deposition chamber 204 includes a nozzle assembly 203 positioned therein. As explained in more detail with respect to FIGS. 3A-3C and FIG. 4, nozzle assembly 203 is configured to spray, for example, a nanoparticle solution onto at least one portion of the formed substructure, such as at least one portion of buffer layer 140, at a predefined pressure.

Deposition system 200 also includes a post-processing chamber 206 that is coupled to deposition chamber 204 via endless conveyor 205. In some embodiments post-processing chamber 206 is configured to conduct a cooling and/or annealing of the formed substructure. For example, post-processing chamber 206 can include a cooling flow device, such as a fan, that is positioned proximate to the formed substructure such that air flow can be directed onto the substructure. Post-processing chamber 206 can also include inert gas, selenium, sulfur, and/or sulfur (chalcogen) for the annealing of the formed substructure.

In some embodiments, a control system 214 is coupled to each of the chambers within deposition system 200, and control system 214 is configured to control various operational parameters, such as temperature and pressure, within each of the chambers. In some embodiments, control system 214 includes a controller 220 that is operatively coupled to vary the operation of deposition system 200 as a function of values determined from sensors responsive to parameters such as temperature and pressure, as well as rates of change of such parameters, according to a programmed control scheme or algorithm. For example, in some embodiments, controller 220 is coupled to at least one valve (not shown) in buffer chamber 202, at least one valve (not shown) in deposition chamber 204, at least one valve (not shown in FIG. 2) of nozzle assembly 203, and at least one valve (not shown) in post-processing chamber 206, for example. In some embodiments, controller 220 is enabled to facilitate operative features of each of the valves, via features that include, without limitation, receiving inputs, transmitting outputs, and transmitting opening and closing commands.

In some embodiments, controller 220 can be a real-time controller and can include any suitable processor-based or microprocessor-based system, such as a computer system, that includes microcontrollers, reduced instruction set circuits (RISC), application-specific integrated circuits (ASICs), logic circuits, and/or any other circuit or processor that is capable of executing the functions described herein. In one embodiment, controller 120 can be a microprocessor that includes read-only memory (ROM) and/or random access memory (RAM), such as, for example, a 32 bit microcomputer with 2 Mbit ROM and 64 Kbit RAM. As used herein, the term "real-time" refers to outcomes occurring in a substantially short period of time after a change in the inputs affect the outcome, with the time period being a design parameter that can be selected based on the importance of the outcome and/or the capability of the system processing the inputs to generate the outcome.

In some embodiments, controller 220 includes a memory device 230 that stores executable instructions and/or one or more operating parameters representing and/or indicating an operating condition of buffer chamber 202, deposition chamber 204, nozzle assembly 203, and post-processing chamber 206. Controller 220 also includes a processor 232 that is coupled to memory device 230 via a system bus 234. In some embodiments, processor 232 can include a processing unit, such as, without limitation, an integrated circuit (IC), an application specific integrated circuit (ASIC), a microcomputer, a programmable logic controller (PLC), and/or any other programmable circuit. Alternatively, processor 232 can include multiple processing units (e.g., in a multi-core configuration). The above examples are exemplary only, and thus are not intended to limit in any way the definition and/or meaning of the term "processor."

Moreover, in some embodiments, controller 220 includes a control interface 236 that is coupled to buffer chamber 202, deposition chamber 204, nozzle assembly 203, and post-processing chamber 206. For example, control interface 236 is coupled to components, such as the valves within buffer chamber 202, deposition chamber 204, nozzle assembly 203, and post-processing chamber 206, and control interface 236 is configured to control an operation of the valves. For example, processor 232 can be programmed to generate one or more control parameters that are transmitted to control interface 236. Control interface 236 can then transmit a control parameter to modulate, open, or close the valves 219, for example.

Various connection protocols are available between control interface 236 and buffer chamber 202, deposition chamber 204, nozzle assembly 203, and post-processing chamber 206. Such connection protocols can include, without limitation, an electrical conductor, a low-level serial data connection, such as Recommended Standard (RS) 232 or RS-485, a high-level serial data connection, such as USB, a field bus, a "PROFIBUS®," or Institute of Electrical and Electronics Engineers (IEEE) 1394 (a/k/a FIREWIRE), a parallel data connection, such as IEEE 1284 or IEEE 488, a short-range wireless communication channel (personal area network) such as "BLUETOOTH," and/or a private (e.g., inaccessible outside system) network connection, whether wired or wireless. "PROFIBUS" is a registered trademark of Profibus Trade Organization of Scottsdale, Ariz. IEEE is a registered trademark of the Institute of Electrical and Electronics Engineers, Inc., of New York, N.Y. "BLUETOOTH" is a registered trademark of Bluetooth SIG, Inc. of Kirkland, Wash.

In some embodiments, control system 214 also includes sensors 219 that are coupled to buffer chamber 202, deposition chamber 204, nozzle assembly 203, and post-processing chamber 206. For example, in some embodiments, controller 220 includes a sensor interface 240 that is communicatively coupled to sensors 219. In some embodiments, sensors 219 are configured to detect various operating parameters, such as temperature and/or pressure, within each of the buffer chamber 202, deposition chamber 204, nozzle assembly 203, and post-processing chamber 206. Sensors 219 each transmit a signal corresponding to their respective detected parameters to controller 220. Sensors 219 can each transmit a signal continuously, periodically, or only once, for example. In other embodiments, different bases are used for signal timings. Furthermore, sensors 219 can each transmit a signal either in an analog form or in a digital form. Various connections are available between sensor interface 240 and sensors 219. Such connections can include, without limitation, an electrical conductor, a low-level serial data connection, such as RS 232 or RS-485, a high-level serial data connection, such as USB or IEEE® 1394, a parallel data connection, such as IEEE® 1284 or IEEE® 488, a short-range wireless communication channel such as BLUETOOTH®, and/or a private (e.g., inaccessible outside system) network connection, whether wired or wireless.

Control system 214 can also include a user computing device 250 that is coupled to controller 220 via a network 249. For example, computing device 250 includes a communication interface 251 that is coupled to a communication interface 253 contained within controller 220. User computing device 250 includes a processor 252 for executing instructions. In some embodiments, executable instructions are stored in a memory device 254. Processor 252 can include one or more processing units (e.g., in a multi-core configuration). Memory device 254 is any device allowing information, such as executable instructions and/or other data, to be stored and retrieved. User computing device 250 also includes at least one media output component 256 for use in presenting information to a user. Media output component 256 is any component capable of conveying information to the user. Media output component 256 can include, without limitation, a display device (not shown) (e.g., a liquid crystal display (LCD), an organic light emitting diode (OLED) display, or an audio output device (e.g., a speaker or headphones)).

Moreover, in some embodiments, user computing device 250 includes an input interface 260 for receiving input from a user. Input interface 260 can include, for example, a keyboard, a pointing device, a mouse, a stylus, a touch sensitive panel (e.g., a touch pad or a touch screen), a gyroscope, an accelerometer, a position detector, and/or an audio input device. A single component, such as a touch screen, can function as both an output device of media output component 256 and input interface 260.

During operation of deposition system 200, substrate 110 is delivered to buffer chamber 202, via endless conveyor 205, wherein substrate 110 is heated in preparation for further processing. Substrate 110 is conveyed on endless conveyor 205 from buffer chamber 202 to deposition chamber 204, wherein layers can be deposited onto substrate 110 via processes, such as sputtering and/or evaporation. For example, back contact layer 120 can be deposited onto substrate 110 and absorber layer 130 can then be formed onto back contact layer 120. P1 process can then take place to scribe the P1 line (shown in FIG. 1) through the back contact layer 120 and absorber layer 130. Buffer layer 140 can then be formed onto absorber layer 130 and the P2 process can take place to scribe the P2 line (shown in FIG. 1) through buffer layer 140 and absorber layer 130. Although the layers are being deposited within deposition chamber 204, additional deposition chambers can be included within system 200 such that different layers can be deposited in different deposition chambers.

As explained in more detail below with respect to FIGS. 3A-3C and FIG. 4, when the P2 process is taking place and the P2 line is being drawn, nozzle assembly 203 sprays a coating material (e.g., a nanoparticle solution) onto at least one portion of buffer layer 140 at a predefined pressure. When a TCO material is later deposited onto buffer layer 140, a TCO layer is inhibited from forming over an area of the portion of the buffer layer 140 that was sprayed with the nanoparticle solution. For example, the nanoparticle solution binds to and interacts with the TCO material and, thus, preventing the TCO material from forming. As such, the TCO layer can be segmented to form segments 150a (shown in FIG. 1) and 150b (shown in FIG. 1), wherein portion 152 (shown in FIG. 1) is the portion that is defined by the area within buffer layer 140 that was sprayed with the nanoparticle solution. Such a division occurs without having the substructure undergo the P3 scribe process. As such, the P3 scribe process can be negated from the overall fabrication process of solar cell 100.

Further, in some embodiments, as explained in more detail with respect to FIGS. 3A-3C and FIG. 4, operational parameters of nozzle assembly 203 can be controlled via control system 214. For example, a user can initially input a predefined threshold value for an operational parameter, such as a pressure value for the nozzle assembly 203 to spray the nanoparticle solution. The predefined value can be programmed with user computing device 250 and/or controller 220. The user can later manually change the pressure by programming the new value into user computing device 250 and/or controller 220. Then controller 220 will transmit a control parameter to, for example, the valve within nozzle assembly 203 such that the nanoparticle solution can be sprayed at another pressure value.

System 200 can also automatically adjust the operating parameters, such as the pressure, within nozzle assembly 203. For example, sensor 219, which is positioned on nozzle assembly 203, can detect the pressure value within nozzle assembly 250 and transmit at least one signal representative of the detected value to controller 220. Depending on whether the detected value is less than, greater than, or equal to the predefined programmed value, controller 220 can transmit a control parameter to nozzle assembly 250 to adjust the pressure such that the programmed value can be obtained.

Figure 3A:
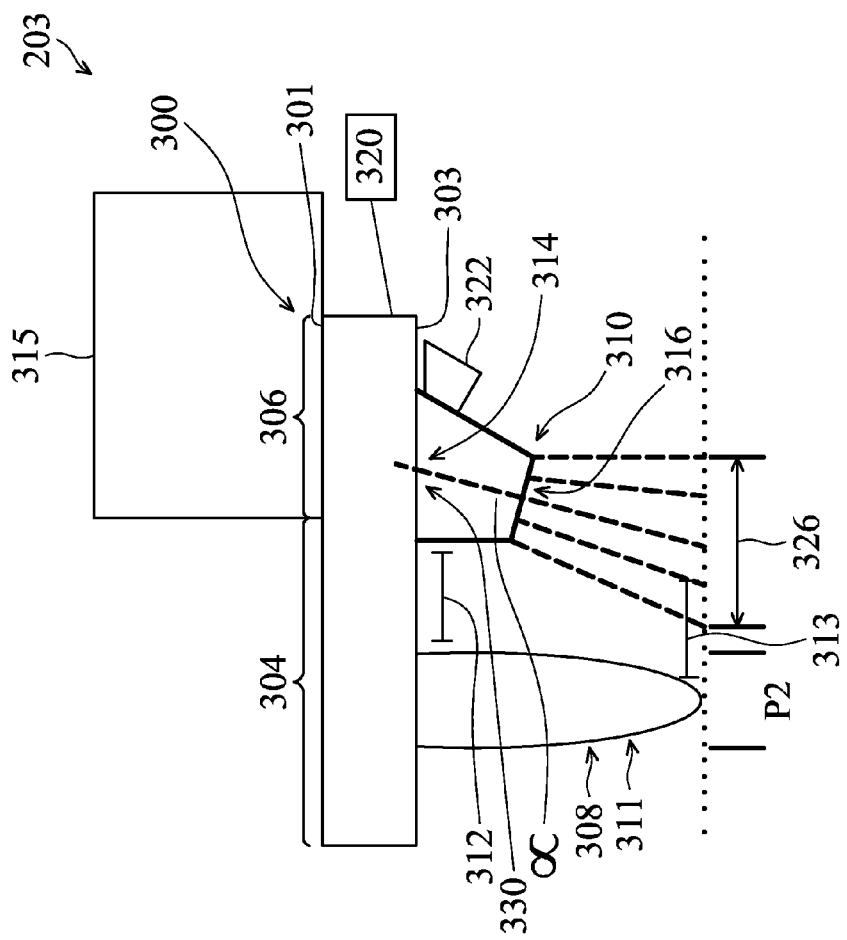
FIGS. 3A-3C are embodiments of an exemplary nozzle assembly used with the deposition system shown in FIG. 2 and taken from area 3.
Figure 3B:
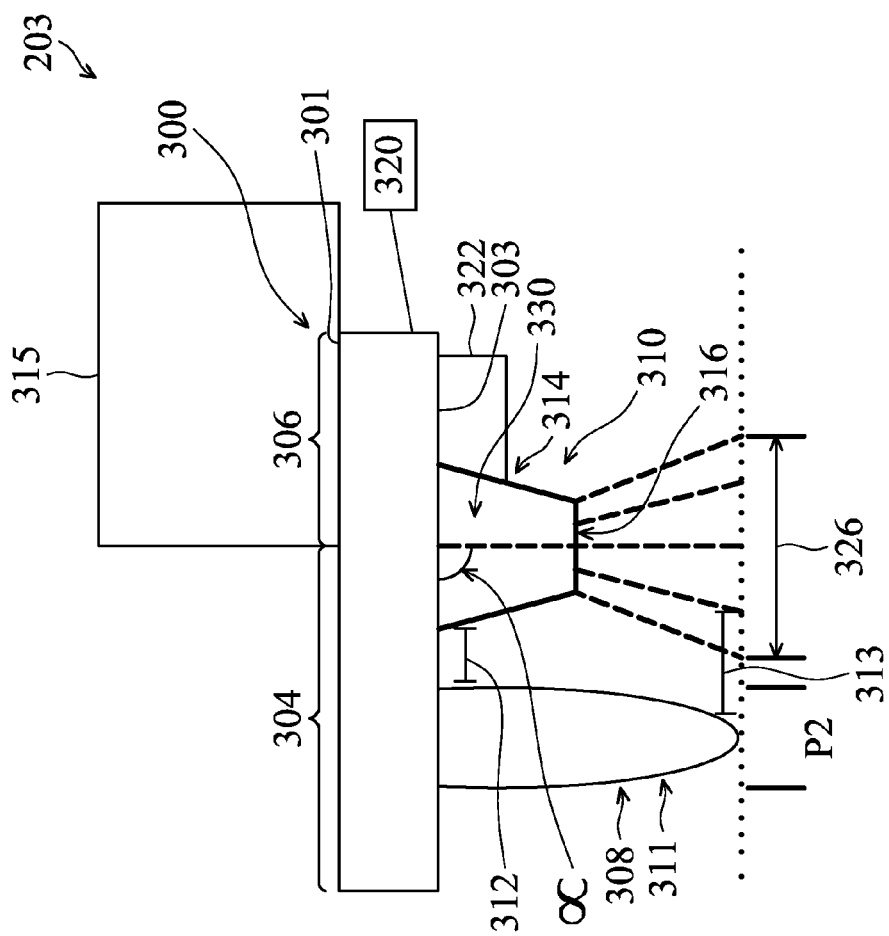
Figure 3C:
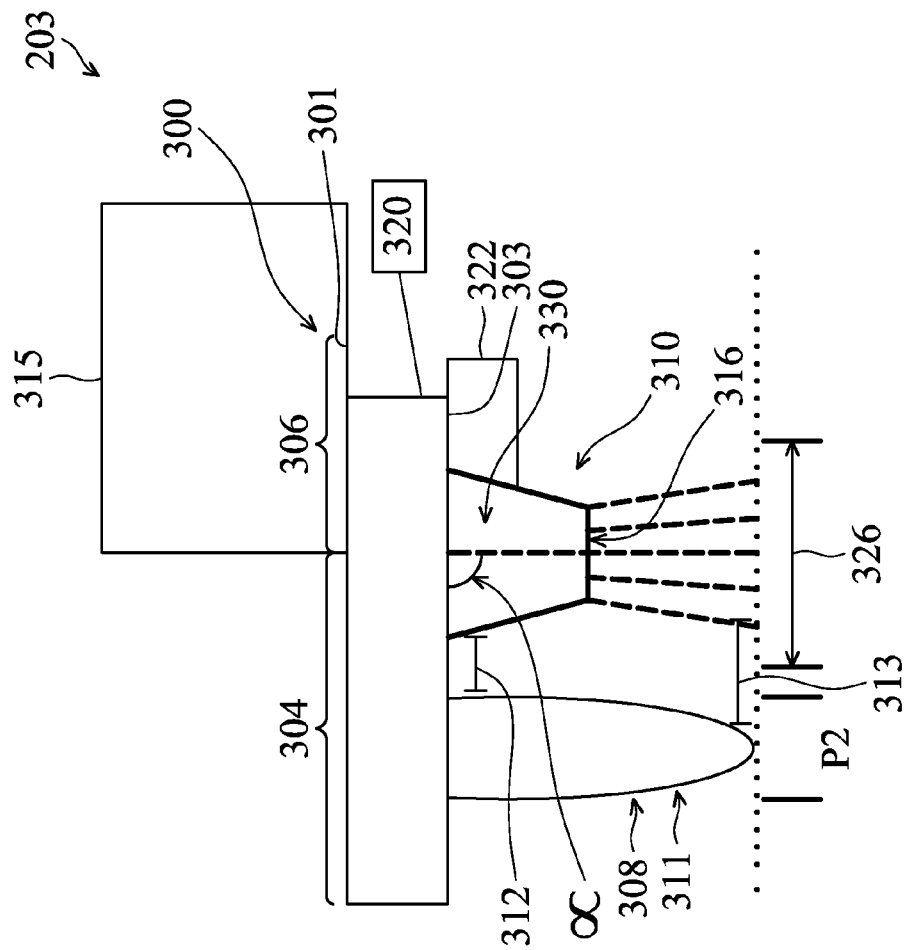

FIGS. 3A-3C illustrate nozzle assembly 203 that is positioned within deposition chamber 204 (shown in FIG. 2) and taken from area 3 (shown in FIG. 2). In some embodiments, nozzle assembly 203 includes a base portion 300 having a first surface 301 and a second surface 303 that is positioned proximate to a substructure, such as a substructure of solar cell 100 (shown in FIG. 1). In addition, base portion 300 includes a first end portion 304 and a second end portion 306, wherein a scriber 308 is coupled to first end portion 304 and a nozzle 310 is coupled to second end portion 306 such that nozzle 310 is positioned a predefined distance 312 from scriber 308. Nozzle 310 and scriber 308 each extend outwardly from second surface 303 of base portion 300. In some embodiments, scriber 308 can be any known scriber that is configured to draw the P2 line (shown in FIG. 1) through buffer layer 140 (shown in FIG. 1) and absorber layer 130 (shown in FIG. 1). As such, in some embodiments, scriber 308 includes a tip portion 311 that is configured to draw the P2 line.

In some embodiments, nozzle 310 includes an inlet end 314 that is coupled to a fluid handling source 315 and an outlet end 316 that is positioned proximate to the substructure. Nozzle 310 is coupled to second end portion 306 of base portion 300 such that nozzle outlet end 316 is positioned a predefined distance 313 from scriber tip 311. In some embodiments, fluid handling source 315 is configured to make a nanoparticle solution. For example, fluid handling source 315 is configured to combine $SiO_2$ nanoparticles with an alcohol, such as isopropyl alcohol, to form an $SiO_2$ nanoparticle solution. Fluid handling source 315 is also configured to deliver the nanoparticle solution to nozzle inlet end 314.

Nozzle outlet end 316 includes a plurality of openings (not shown) such that the nanoparticle solution can be delivered to the openings and sprayed onto the substructure. For example, in some embodiments, nozzle assembly 203 includes a pump 320 coupled to nozzle 310 such that the nanoparticle solution can be sprayed through the openings of nozzle outlet end 316 at a predefined pressure. Moreover, positioned proximate to nozzle inlet end 314 is a valve 322 that is configured to be modulated by control system 214 (shown in FIG. 2) such that the pressure that the nanoparticle solution is being sprayed at can be adjusted. For example, when nozzle 310 is spraying the nanoparticle solution onto substructure, the solution is being sprayed onto at least one portion of buffer layer 140, for example. For example, the nanoparticle solution is being sprayed onto area 326 of buffer layer 140 at the predefined pressure, as shown in FIG. 3B. Valve 322 can be partially closed such that the pressure that the nanoparticle solution is being sprayed at substantially decreases and the predefined area 326 that is being sprayed becomes relatively smaller, as shown in FIG. 3C.

In some embodiments, the positioning of nozzle 310 is also adjustable. For example, nozzle 310 includes a centerline 330, and nozzle 310 is moveable such that the relationship between centerline 330 and second surface 303 of base portion 300 can vary. For example, an angle α is defined between centerline 330 and second surface 303. In some embodiments, nozzle 310 extends outwardly from second surface 303 such that angle α is equal to 90 degrees and centerline 330 is perpendicular with respect second surface, as shown in FIGS. 3B and 3C. In some embodiments, the nozzle 310 can be moved, such that nozzle 310 extends outwardly from second surface 303, angle α is less than 90 degrees, and nozzle 310 is no longer perpendicular with respect to second surface 303, as shown in FIG. 3A. As such, the predefined distance 313 between nozzle outlet end 316 and scriber tip 311 can change, as shown in FIG. 3A.

Figure 4:
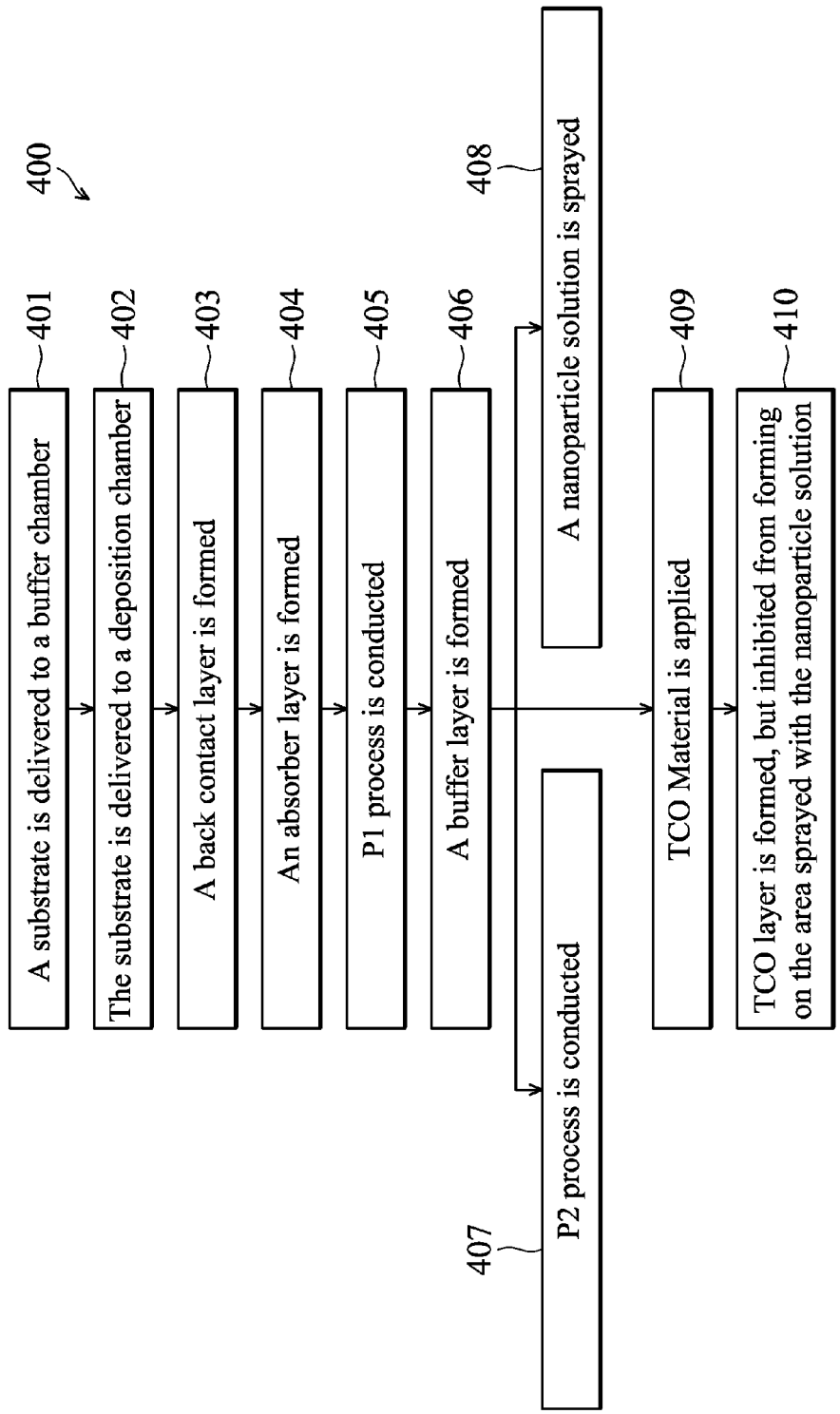
FIG. 4 is flow diagram of an exemplary method of forming the solar cell shown in FIG. 1.

FIG. 4 is flow diagram 400 of a method for fabricating a solar cell, such as solar cell 100 (shown in FIG. 1), using nozzle assembly 203 (shown in FIG. 2 and FIGS. 3A-3C). In step 401, substrate 110 (shown in FIG. 1) is delivered to buffer chamber 202 (shown in FIG. 2), via endless conveyor 205 (shown in FIG. 2), wherein substrate 110 is heated in preparation for further processing.

In step 402, substrate 110 is conveyed on endless conveyor 205 from buffer chamber 202 to deposition chamber 204 (shown in FIG. 2), wherein layer materials can be deposited onto substrate 110 to form layers on substrate 110 via processes, such as sputtering and/or evaporation.

For example, in step 403, back contact layer material can be deposited onto substrate 110 to form back contact layer 120 (shown in FIG. 1) and, in step 404, absorber layer 130 is formed onto back contact layer 120. In step 405, the P1 is conducted, wherein a scriber is used to scribe the P1 line (shown in FIG. 1) through back contact layer 120 and absorber layer 130 such that the absorber layer material fills the P1 line.

In step 406, buffer layer 140 (shown in FIG. 1) is formed onto absorber layer 130. The P2 process is conducted in step 407, wherein scriber 308 (shown in FIGS. 3A-3C) uses tip portion 311 to scribe the P2 line through buffer layer 140 and absorber layer 130. Simultaneously with step 407, nozzle 310 (shown in FIGS. 3A-3C) sprays a nanoparticle solution onto at least one portion of the buffer layer 140 in step 408. For example, the nanoparticle solution is delivered from fluid handling source 315 (shown in FIGS. 3A-3C) to nozzle inlet end 314 (shown in FIGS. 3A-3C), and then the nanoparticle solution enters the nozzle outlet end 316 (shown in FIGS. 3A-3C) such that the solution can be sprayed through the openings (not shown) of nozzle outlet end 316 onto area 326 (shown in FIGS. 3A-3C) on buffer layer 140.

In step 409, TCO material is applied onto buffer layer 140 such that TCO layer or first contact layer 150 (shown in FIG. 1) can form onto buffer layer 140. In step 410, the TCO layer forms 150 over buffer layer 140, but is inhibited from forming over area 326 of the buffer layer 140 that was sprayed with the nanoparticle solution. Area 326 defines portion 152 (shown in FIG. 1), which is the portion within front contact layer 150 that does not include TCO layer 150 and divides first contact layer 150 into segments 150a (shown in FIG. 1) and 150b (shown in FIG. 2). For example, in the area where the nanoparticle solution is located, the nanoparticle solution binds to and interacts with the TCO material and, thus, prevents the TCO material from forming. As such, the TCO layer can be segmented into segments 150a and 150b without having to undergo the P3 scribe process. Accordingly, the P3 scribe process can be negated from the overall fabrication method of solar cell 100.

Further, in some embodiments, operational parameters of nozzle assembly 203 can be controlled via control system 214 (shown in FIG. 2). For example, a user can initially input a predefined threshold value for an operational parameter, such as a pressure value at which the nozzle 310 is spraying the nanoparticle solution. The predefined value can be programmed with user computing device 250 (shown in FIG. 2) and/or controller 220 (shown in FIG. 2). The user can later manually change the pressure by programming the new value into user computing device 250 and/or controller 220. Then controller 220 will transmit a control parameter to, for example, valve 322 (shown in FIGS. 3A-3C) such that the nanoparticle solution can be sprayed at another pressure value through nozzle outlet end 316.

The operating parameters, such as the pressure, within nozzle assembly 203 can also be automatically adjusted. For example, sensor 219 (shown in FIG. 2) can detect the pressure value within nozzle 310 and transmit at least one signal representative of the detected pressure value to controller 220. Depending on whether the detected value is less than, greater than, or equal to the predefined programmed value, controller 220 can transmit a control parameter to valve 322 to adjust the pressure.

Some embodiments described herein provide a nozzle assembly that facilitates the division of a large solar module into an array of smaller series of interconnected structures on a substrate without having to perform the P3 scribe process. The nozzle assembly includes a nozzle that is coupled to and positioned proximate to a tip of a scriber that is configured to be used for the P2 scribe process. As such, during the P2 scribe process, when the scriber tip is scribing a P2 line through a buffer layer and an absorber layer of a substructure, the nozzle sprays a nanoparticle solution onto at least one portion of the buffer layer at a predefined pressure. When a transparent conductive oxide (TCO) material is later deposited onto the buffer layer, a TCO layer is inhibited from forming over the portion of the buffer layer that was sprayed with the nanoparticle solution. As such, the TCO layer is segmented without having to undergo the P3 scribe process and, as a result, the P3 scribe process can be negated from the solar cell fabrication process.

In some embodiments, a method for fabricating a solar cell is provided and includes using a nozzle assembly that includes a base portion, a scriber coupled to the base portion, and a nozzle coupled to the base portion such that the nozzle is positioned a predefined distance from a tip of the scriber. The method includes positioning a substructure that includes a buffer layer and an absorber layer proximate to the base portion. A P2 line is scribed through the buffer and absorber layers of the substructure using the scriber tip. A nanoparticle solution is sprayed, using the nozzle, onto at least one portion of the buffer layer at a predefined pressure when the P2 line is being scribed through the buffer and absorber layers such that a transparent conductive oxide (TCO) layer is inhibited from forming over the portion of the buffer layer that is being sprayed with the nanoparticle solution.

In some embodiments, a nozzle assembly includes a base portion that is configured to be positioned proximate to a substructure. A scriber is coupled to the base portion, wherein the scriber includes a tip that is configured to draw a P2 line though a buffer layer and an absorber layer of the substructure. A nozzle is coupled to the base portion such that the nozzle is positioned a predefined distance from the scriber tip, wherein the nozzle is configured to spray a nanoparticle solution onto at least one portion of the buffer layer at a predefined pressure when the P2 line is being drawn through the buffer and absorber layers such that a transparent conductive oxide (TCO) layer is inhibited from forming over the portion of the buffer layer that is being sprayed with the nanoparticle solution.

In some embodiments, a deposition system includes a conveyor configured to move a substructure within therein and a nozzle assembly coupled to the conveyor. The nozzle assembly includes a base portion that is configured to be positioned proximate to a substructure. A scriber is coupled to the base portion, wherein the scriber includes a tip that is configured to draw a P2 line though a buffer layer and an absorber layer of the substructure. A nozzle is coupled to the base portion such that the nozzle is positioned a predefined distance from the scriber tip, wherein the nozzle is configured to spray a nanoparticle solution onto at least one portion of the buffer layer at a predefined pressure when the P2 line is being drawn through the buffer and absorber layers such that a transparent conductive oxide (TCO) layer is inhibited from forming over the portion of the buffer layer that is being sprayed with the nanoparticle solution Although the deposition system and method described herein have been described in terms of exemplary embodiments, they are not limited thereto. Rather, the appended claims should be construed broadly, to include other variants and embodiments of the disclosed system and method, which can be made by those skilled in the art without departing from the scope and range of equivalents of the system and method.

What is claimed is:

1. A method for fabricating a solar cell, said method comprising:
    positioning a substructure that includes a buffer layer and an absorber layer proximate to a tip of a scriber;
    scribing a P2 scribe line through the buffer and absorber layers of the substructure using the scriber tip; and
    depositing a nanoparticle solution onto at least one portion of the buffer layer proximate the P2 scribe line, when the P2 scribe line is being scribed through the buffer and absorber layers, such that a transparent conductive oxide (TCO) layer is inhibited from forming over the at least one portion of the buffer layer.

2. The method of claim 1, wherein depositing the nanoparticle solution comprises spraying a silicon dioxide nanoparticle solution onto the at least one portion of the buffer layer.

3. The method of claim 1, further comprising extending a nozzle outwardly from a base portion of an apparatus containing the scriber, such that a centerline of the nozzle is at a non-perpendicular angle with respect to a surface of the base portion.

4. The method of claim 1, further comprising extending a nozzle outwardly from a base portion of an apparatus containing the scriber, such that a centerline of the nozzle is perpendicular with respect to a surface of the base portion.

5. The method of claim 1, further comprising moving a nozzle with respect to a base portion of an apparatus containing the scriber, such that a predefined distance between the nozzle and the scriber tip changes.

6. The method of claim 1, wherein depositing the nanoparticle solution comprises spraying a nanoparticle solution onto a predefined area on a surface of the buffer layer.

7. The method of claim 6, further comprising changing a pressure of a nozzle that is used to perform the spraying, such that the predefined area on the surface that is being sprayed with the nanoparticle solution varies.

8. A method for fabricating a solar cell, said method comprising:
- positioning a substructure that includes a buffer layer and an absorber layer proximate to a tip of a scriber;
- scribing a P2 scribe line through the buffer and absorber layers of the substructure using the scriber tip;
- depositing a nanoparticle solution onto at least one portion of the buffer layer when the P2 scribe line is being scribed through the buffer and absorber layers, the nanoparticle solution capable of preventing deposition of a transparent conductive oxide (TCO) layer on the at least one portion of the buffer layer; and
- forming the TCO layer over the buffer layer except over the at least one portion of the buffer layer, so as to form a P3 scribe line through the TCO layer.

9. The method of claim 8, wherein depositing the nanoparticle solution comprises spraying a silicon dioxide nanoparticle solution onto the at least one portion of the buffer layer.

10. The method of claim 8, further comprising extending a nozzle outwardly from a base portion of an apparatus containing the scriber, such that a centerline of the nozzle is at a non-perpendicular angle with respect to a surface of the base portion.

11. The method of claim 8, further comprising extending a nozzle outwardly from a base portion of an apparatus containing the scriber, such that a centerline of the nozzle is perpendicular with respect to a surface of the base portion.

12. The method of claim 8, further comprising moving a nozzle with respect to a base portion of an apparatus containing the scriber, such that a predefined distance between the nozzle and the scriber tip changes.

13. The method of claim 8, wherein depositing the nanoparticle solution comprises spraying a nanoparticle solution onto a predefined area on a surface of the buffer layer.

14. The method of claim 13, further comprising changing a pressure of a nozzle that is used to perform the spraying, such that the predefined area on the surface that is being sprayed with the nanoparticle solution varies.

15. A method for fabricating a solar cell, said method comprising:
- positioning a substructure that includes a buffer layer and an absorber layer proximate to a tip of a scriber;
- scribing a P2 scribe line through the buffer and absorber layers of the substructure using the tip of the scriber; and
- depositing a nanoparticle solution onto at least one portion of the buffer layer proximate the P2 scribe line, when the P2 scribe line is being scribed through the buffer and absorber layers, the nanoparticle solution capable of preventing deposition of a transparent conductive oxide (TCO) layer;
- forming the TCO layer over the buffer layer except over the at least one portion of the buffer layer, so as to form a P3 scribe line through the TCO layer.

* * * * *